(12) United States Patent
Zhu et al.

(10) Patent No.: US 7,504,696 B2
(45) Date of Patent: Mar. 17, 2009

(54) CMOS WITH DUAL METAL GATE

(75) Inventors: Huilong Zhu, Poughkeepsie, NY (US); Zhijiong Luo, Carmel, NY (US); Dae-Gyu Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 11/306,748

(22) Filed: Jan. 10, 2006

(65) Prior Publication Data

US 2007/0278590 A1   Dec. 6, 2007

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/369; 257/374; 257/E27.06
(58) Field of Classification Search .................. 257/351, 257/369, 374, 388, 391, 392, E27.06, E27.062
See application file for complete search history.

(56) References Cited

U.S. PATENT DOCUMENTS

| | | | |
|---|---|---|---|
| 6,066,533 A | 5/2000 | Yu | |
| 6,552,377 B1 * | 4/2003 | Yu | 257/288 |
| 6,653,698 B2 | 11/2003 | Lee et al. | |
| 7,229,877 B2 * | 6/2007 | Cheng et al. | 438/241 |
| 7,282,402 B2 * | 10/2007 | Sadaka et al. | 438/221 |
| 7,344,934 B2 * | 3/2008 | Li | 438/199 |
| 2003/0001493 A1 | 1/2003 | Park | |
| 2003/0119292 A1 | 6/2003 | Lee et al. | |
| 2005/0106788 A1 | 5/2005 | Amos et al. | |

* cited by examiner

*Primary Examiner*—Hoai V Pham
(74) *Attorney, Agent, or Firm*—Gibb I.P. Law Firm, LLC; Todd M. C. Li, Esq.

(57) ABSTRACT

Embodiments herein present a structure and method to make a CMOS with dual metal gates. Specifically, the CMOS comprises a first gate comprising a first metal and a second gate comprising a second metal. The first gate comprises a portion of a first transistor that is complementary to a second transistor that includes the second gate, wherein the first gate and the second gate are situated on the same substrate. Furthermore, the first metal produces a first threshold voltage characteristic, wherein the first metal comprises tantalum. The second metal produces a second threshold voltage characteristic that differs from the first threshold voltage characteristic, wherein the second metal comprises tungsten.

13 Claims, 18 Drawing Sheets

CMOS WITH DUAL METAL GATE

BACKGROUND OF THE INVENTION

1. Field of the Invention

Embodiments herein present a complementary metal oxide semiconductor (CMOS) with dual metal gates.

2. Description of the Related Art

In current metal oxide semiconductor field effect transistors (MOSFETs), a polysilicon gate and an oxide dielectric are typically employed. To enhance device performance and reduce manufacturing costs, critical dimension, i.e., gate length, is aggressively scaled down. This requires effective thickness of gate dielectric to be scaled down to obtain proper device properties such as good control of short channel effect. Due to polysilicon depletion, the polysilicon gate can increase the effective thickness by about 0.5 nm, which contributes 25% of the effective thickness for current high performance MOSFETs. Thinnest gate oxide is about 1 nm in current technology, which contributes 50% of the effective thickness. Another 25% of the effective thickness comes from the channel of a MOSFET. Since gate leakage current increase dramatically when the gate oxide thickness is thinner than 1 nm and then it causes the increasing of power consumption, it is difficult to decrease the oxide thickness further. Therefore, it is preferable to replace polysilicon gate by metal gate to reduce the effective thickness of gate dielectric.

MOSFETs including a gate stack comprising a bottom polysilicon portion and a top silicide portion are also known. The layer of silicide in such a gate stack contributes to a decrease in the resistance of the gate. The decrease in resistance causes a decrease in the time propagation delay RC of the gate. Although a silicide top gate region may help decrease the resistance of the transistor, charge is still depleted in the vicinity of the interface formed between the bottom polysilicon gate and gate dielectric, thereby causing a larger effective dielectric thickness or a smaller effective gate capacitance.

Another type of MOSFET that is available is one where the gate electrode is made entirely of a metal. In such MOSFETs, the metal of the gate prevents depletion of charge through the gate. This prevents the increase in effective thickness of the gate capacitor and the capacitance decreases as a result of the depletion effect.

In order to obtain desirable threshold voltages for nMOSFET and pMOSFET with metal gates, usually different type of metals are needed. It is generally quite difficult to offer metal gate transistors with different type of metals within the same wafer. Thus, semiconductors having metal gate transistors with different type of metals on the same wafer are needed in order to provide design flexibility for low-power, high-performance, and zero mixed-signal applications for overall system performance.

SUMMARY OF THE INVENTION

Embodiments herein present a structure and method to make a CMOS with dual metal gates, namely, for nMOSFET and pMOSFET their metal gates with different work functions. Specifically, the CMOS comprises a first gate comprising a first metal with a first work function and a second gate comprising a second metal with a second work function. The first gate comprises a portion of a first transistor that is complementary to a second transistor that includes the second gate, wherein the first gate and the second gate are situated on the same substrate. Furthermore, the first metal produces a first threshold voltage characteristic, wherein the first metal comprises tantalum. The second metal produces a second threshold voltage characteristic that differs from the first threshold voltage characteristic, wherein the second metal comprises tungsten.

The CMOS device further comprises an epitaxial silicon layer and a notched shallow trench isolation oxide region. The epitaxial silicon layer is situated below the second gate; and, the notched shallow trench isolation oxide region is positioned between the first transistor and the second transistor. Further, the notched shallow trench isolation oxide region comprises a first upper surface and a second upper surface, wherein the first upper surface is situated above the substrate, and wherein the second upper surface is situated below the substrate. In addition, the CMOS device comprises a gate dielectric, wherein the gate dielectric comprises SiO2, nitrided SiO2, HfO2, ZrO2, Al2O3, TiO2, La2O3, SrTiO3, LaAlO3, and/or mixtures thereof.

Accordingly, embodiments herein present a structure and method to make a CMOS with dual metal gates. CMOS devices with polysilicon gates typically have a relatively large insulator thickness due to poly depletion. Metal gates can reduce insulator thickness for both n-type field effect transistors (NFETs) and p-type field effect transistors (PFETs); however, it is difficult to adjust the threshold voltage for both NFETs and PFETs in the same device. Recent research shows that metal gates are thermally stable for high temperature processes for both NFETs and PFETs. However, the art lacks a device and a process flow to manufacture such a device for both NFETs and PFETs on the same wafer. As such, embodiments of the invention provide a structure and a method for making a CMOS device with dual metal gates, wherein a metal gate NFET and a metal gate PFET are integrated on the same wafer to take advantage of MOSFETs. Specifically, embodiments of the invention use different metal gates to adjust the threshold voltage for the NFET and the PFET separately.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF THE PREFERRED EMBODIMENTS OF THE INVENTION

Figure 1:
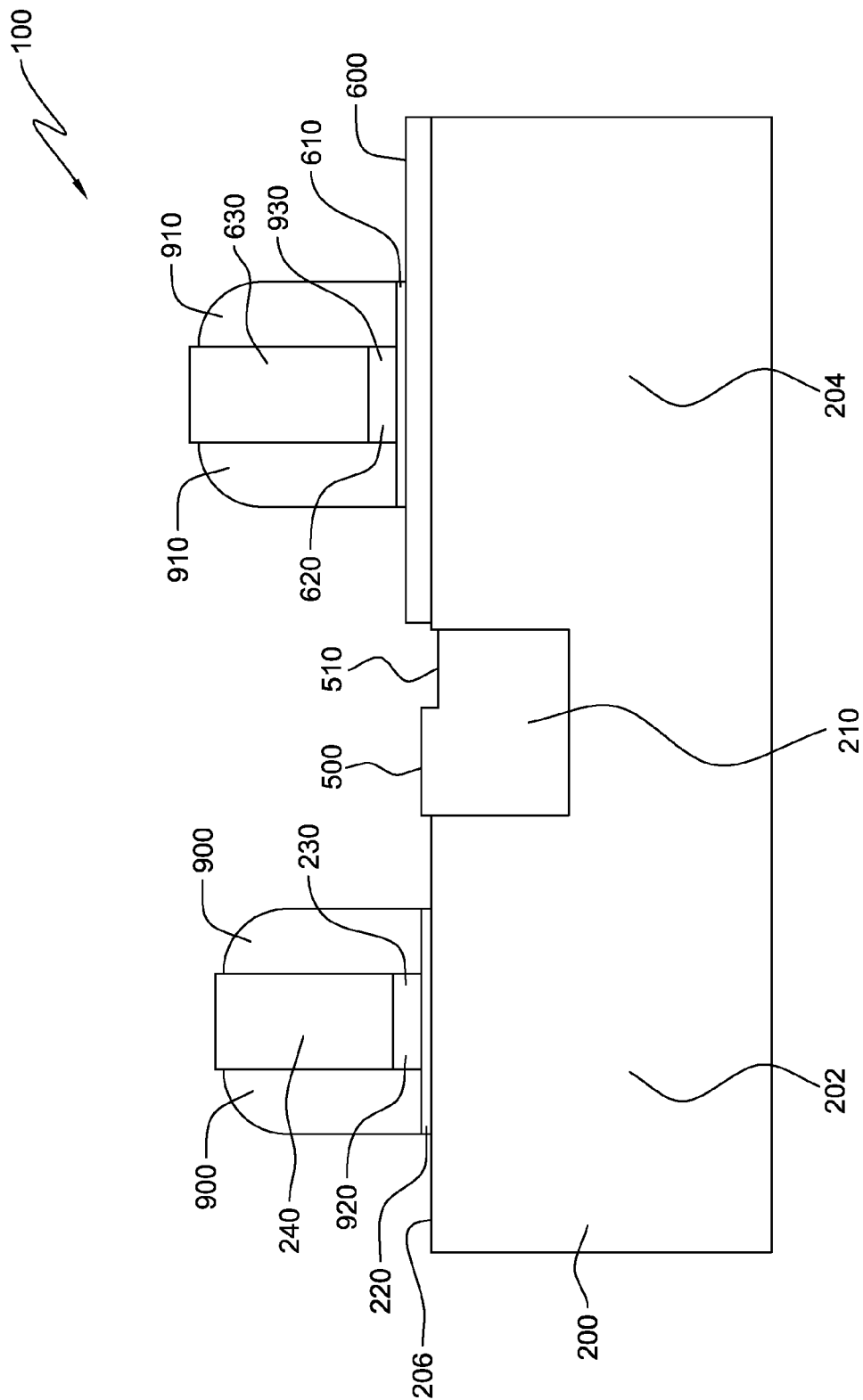
FIG. 1 is a schematic diagram illustrating a CMOS device of the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Accordingly, embodiments herein present a structure and method to make a CMOS with dual metal gates. CMOS devices with polysilicon gates typically have a relatively large insulator thickness due to poly depletion. Metal gates can reduce insulator thickness for both n-type field effect transistors (NFETs) and p-type field effect transistors (PFETs); however, it is difficult to adjust the threshold voltage for both NFETs and PFETs in the same wafer. Recent research shows that metal gates are thermally stable for high temperature processes for both NFETs and PFETs. However, the art lacks a process flow to manufacture for both NFETs and PFETs on the same wafer. As such, embodiments of the invention provide a structure and a method for making a CMOS device/ NFET and PFET with dual metal gates, wherein a metal gate NFET and a metal gate PFET are integrated on the same wafer to take advantage of metal gate for both NFET and PFET. Specifically, embodiments of the invention use different metal gates to adjust the threshold voltage for the NFET and the PFET separately.

Referring now to the drawings, FIG. 1 illustrates a CMOS device 100 generally comprising a substrate 200, a shallow trench isolation (STI) oxide member 210, an n-type field effect transistor (NFET) 920, and an n-type field effect transistor (PFET) 930. More specifically, the substrate 200 may be a any suitable wafer substrate, including but not limited to a bulk wafer or SOI (silicon-on-insulator) wafer, as is commonly known within the art. Typical CMOS-based chips are doped with impurities, which enable a chip to store capacitance that must be discharged and recharged. SOI chips, on the other hand, are formed by setting transistors on a thin silicon layer that is separated from a silicon substrate by an insulating layer of thin silicon oxide or glass. Such a structure minimizes capacitance, and/or power consumption of the transistor.

The STI oxide member 210 is situated within an upper middle portion of the substrate 200, wherein the STI oxide member 210 separates the NFET 920 from the PFET 930. The STI oxide member 210 comprises a substantially square-shaped cross-section having an approximate width between 100-500 nm and an approximate depth between 100-1000 nm. Furthermore, the STI oxide member 210 comprises a notched top portion, wherein a first upper surface 500 is staggered from a second upper surface 510. Specifically, the first upper surface 500 is situated above a top surface 206 of the substrate 200; and, the second upper surface 510 is situated below the top surface 206 of the substrate 200.

The NFET 920 comprises a gate oxide 220 (also referred to herein as "dielectric 220"), a first gate layer 230, a second gate layer 240, and spacers 900, wherein the NFET 920 is situated on the top surface 206 of the substrate 200, proximate the first upper surface 500 of the STI oxide member 210. Specifically, the gate oxide 220 is situated over the top surface 206 of the substrate 200 and below the first gate layer 230, wherein the gate oxide 220 is covered by the spacers 900, the first gate layer 230, and the second gate layer 240. The gate oxide 220 acts as a dielectric to insulate the first gate layer 230 and the second gate layer 240 from the substrate components, thereby giving the NFET 920 a large input impedance. It is contemplated in an alternative embodiment that, instead of oxide, a hi-k material may be utilized to form the gate dielectric.

The first gate layer 230 is situated on a top middle portion of the gate oxide 220. The first gate layer 230 comprises a first thermally stable metal, for example, tantalum nitride, wherein the first thermally stable metal produces a threshold voltage characteristic that differs from a threshold voltage characteristic produced by a second thermally stable metal, as more fully described below. The first gate layer 230 may be formed via atomic-layer-deposition (ALD) followed by nitridation.

The second gate layer 240 is situated over the first gate layer 230, wherein the second gate layer 240 comprises polysilicon. Moreover, the second gate layer 240 may be pre-doped via n-type dopant implantation utilizing phosphorus 1e15-4e15/cm$^2$. The first gate layer 230 and the second gate layer 240 each have an approximate height of 10 nm-30 nm and 30 nm-120 nm, respectively. The first gate layer 230 and the second gate layer 240 are used to control output current (i.e., the flow of carriers) in the NFET 920, as is commonly known within the art. The spacers 900 are situated over the dielectric 220, wherein the spacers 900 passivate sidewalls of the first gate layer 230 and the second gate layer 240. The spacers 900 may be deposited by chemical vapor deposition (CVD) and followed by anisotropically etch, as is commonly known within the art.

The PFET 930 comprises a gate oxide 610 (also referred to herein as "dielectric 610"), a first gate layer 620, a second gate layer 630, spacers 910, and an epitaxial silicon layer 600. The PFET 930 is situated on the top surface 206 of the substrate 200, proximate the second upper surface 510 of the STI oxide member 210. More specifically, the epitaxial silicon layer 600 is situated over the substrate 200 to ensure that the first gate layer 620 and the second gate layer 630 are built on a high quality silicon surface. The epitaxial silicon layer 600 has an approximate height between 20-30 nm to adjust the combined height of the first gate layer 620 and the second gate layer 630 to a height that is substantially similar to the combined height of the first gate layer 230 and the second gate layer 240 of the NFET 920. The NFET 920 could have the epitaxial silicon layer 600 too; however, only the NFET 920 or the PFET 930 has the epitaxial silicon layer 600. It can be on the NFET 920 or the PFET 930, but not both.

The dielectric 610 is situated over the epitaxial silicon layer 600 and below the first gate layer 620, wherein the gate oxide 610 is covered by the spacers 910, the first gate layer 620, and the second gate layer 630. The gate oxide 610 acts as a dielectric to insulate the first gate layer 620 and the second gate layer 630 from the substrate components, thereby giving the PFET 930 a large input impedance. It is contemplated in an alternative embodiment that, instead of oxide, a hi-k material may be utilized to form the gate dielectric.

The first gate layer 620 is situated on a top middle portion of the gate oxide 610, wherein the first gate layer 620 comprises a second thermally stable metal, for example, tungsten nitride. The second thermally stable metal produces a threshold voltage characteristic that differs from the threshold voltage characteristic produced by the first thermally stable metal of the NFET 920. Moreover, the first gate layer 620 may be formed via atomic-layer-deposition followed by nitridation.

The second gate layer 630 is situated over the first gate layer 620, wherein the second gate layer 630 comprises polysilicon. Moreover, the second gate layer 630 may be pre-doped via p-type dopant implantation utilizing boron 1e15-4e15/cm$^2$. The first gate layer 620 and the second gate layer 630 each have an approximate height of 10 nm-30 nm and 30 nm-120 nm, respectively. The first gate layer 620 and the second gate layer 630 are used to control output current (i.e., the flow of carriers) in the PFET 930, as is commonly known within the art. The spacers 910 are situated over the gate oxide 610, wherein the spacers 910 passivate sidewalls of the first gate layer 620 and the second gate layer 630. The spacers 910 may be deposited by chemical vapor deposition (CVD), and followed by anisotropic etch, as is commonly known within the art.

Figure 2:
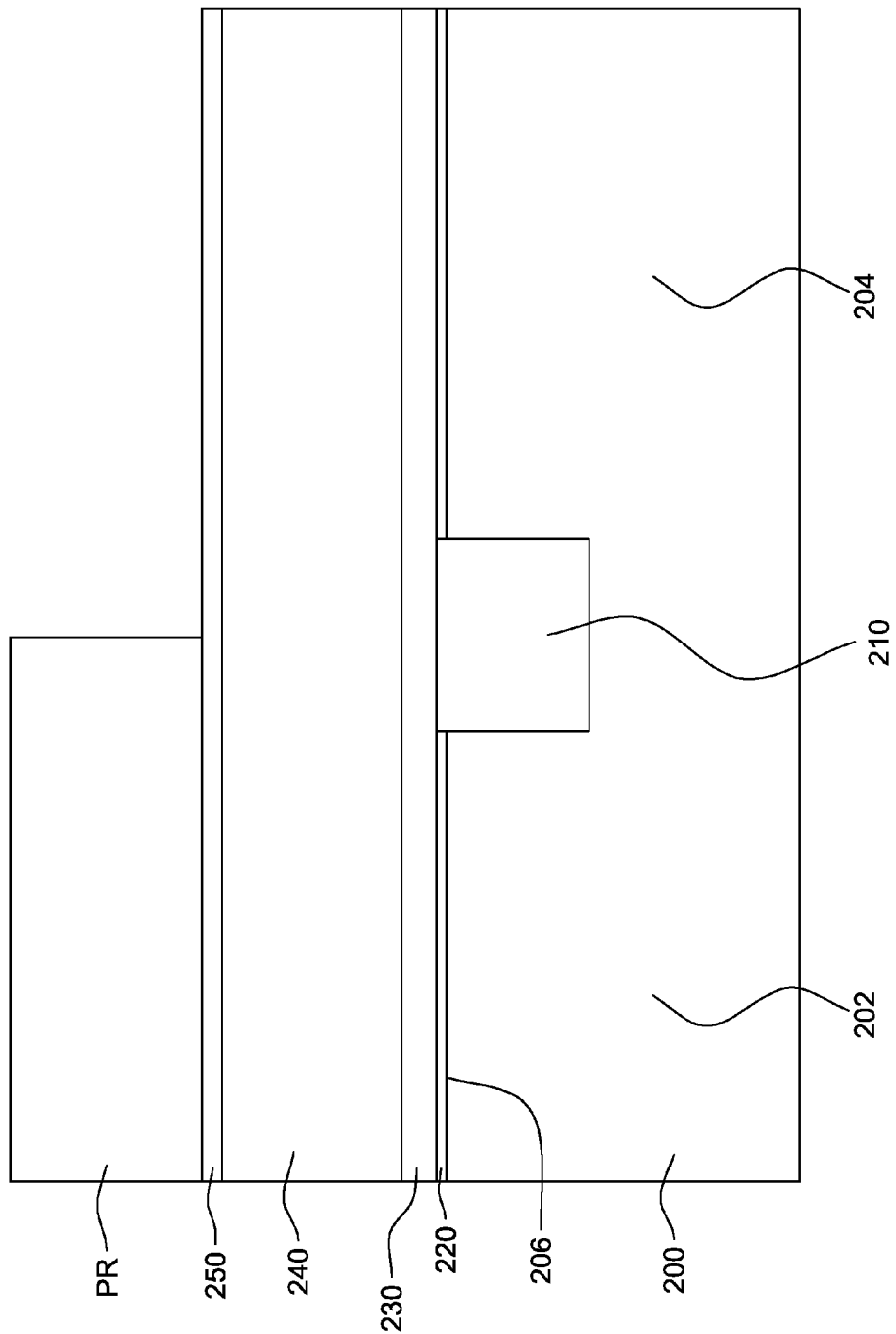
FIG. 2 is a schematic diagram illustrating a method step of the invention.

As illustrated in FIGS. 2-9, embodiments of the invention further provide a method for making the CMOS device 100. As illustrated in FIG. 2, the method begins with a wafer substrate 200, which may be any suitable substrate, including but not limited to, a conventional bulk or SOI wafer, wherein the STI oxide member 210 is formed within an upper middle portion thereof via conventional processes. As described above, the STI oxide member 210 has an approximate width of 50-500 nm and an approximate depth of 100-1000 nm. Further, the STI oxide member 210 separates an NFET region 202 of the substrate 200 from a PFET region 204 of the substrate 200.

Next, a gate oxide layer 220 (also referred to herein as the "dielectric layer 220", the "gate oxide 220", or the "dielectric 220") is formed over a top surface 206 of the substrate 200. For example, the gate oxide layer 220 could be formed from high-k material, such as HfO$_2$, ZrO$_2$, Al$_2$O$_3$, TiO$_2$, La$_2$O$_3$, SrTiO$_3$, LaAlO$_3$, or mixtures thereof. Subsequently, a first metal layer 230 (also referred to herein as the "first gate layer 230") is formed over the gate oxide layer 220 and over the STI oxide member 210. For example, a layer of tantalum having an approximate height of 10 nm-30 nm may be formed via atomic-layer-deposition, followed by nitridation to form thermally stable tantalum nitride. A polysilicon layer 240 (also referred to herein as the "second gate layer 240") having an approximate height of 30 nm-120 nm is subsequently formed over the first metal layer 230, wherein the polysilicon layer 240 may be pre-doped via n-type dopant implantation utilizing phosphorus 1e15-4e15/cm$^2$. Following this, a nitride layer 250 is formed over the polysilicon layer 240, wherein a photoresist PR is positioned over a portion of the nitride layer 250 over NFET region 202.

Figure 3:
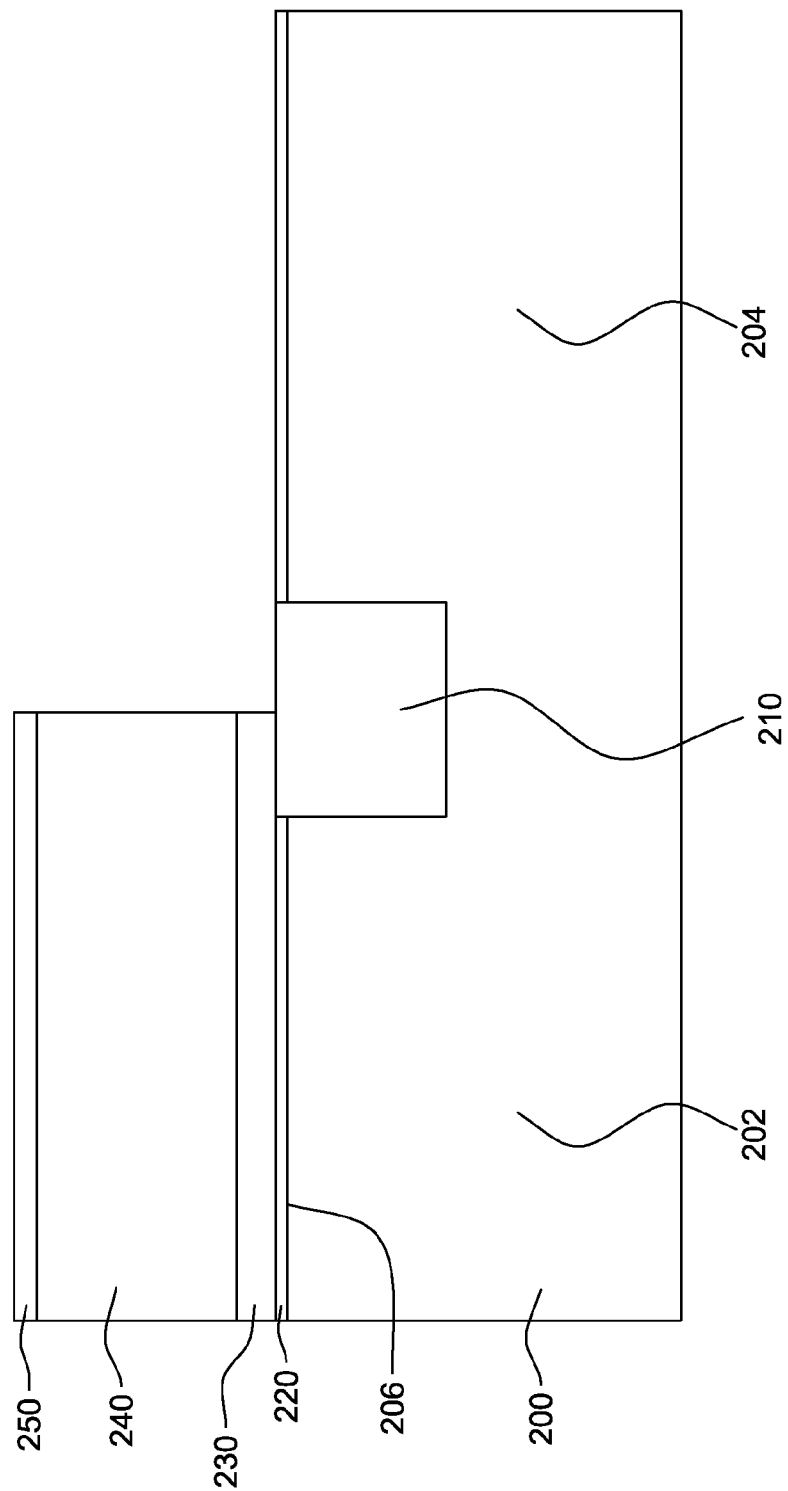
FIG. 3 is a schematic diagram illustrating a method step of the invention.
Figure 4:
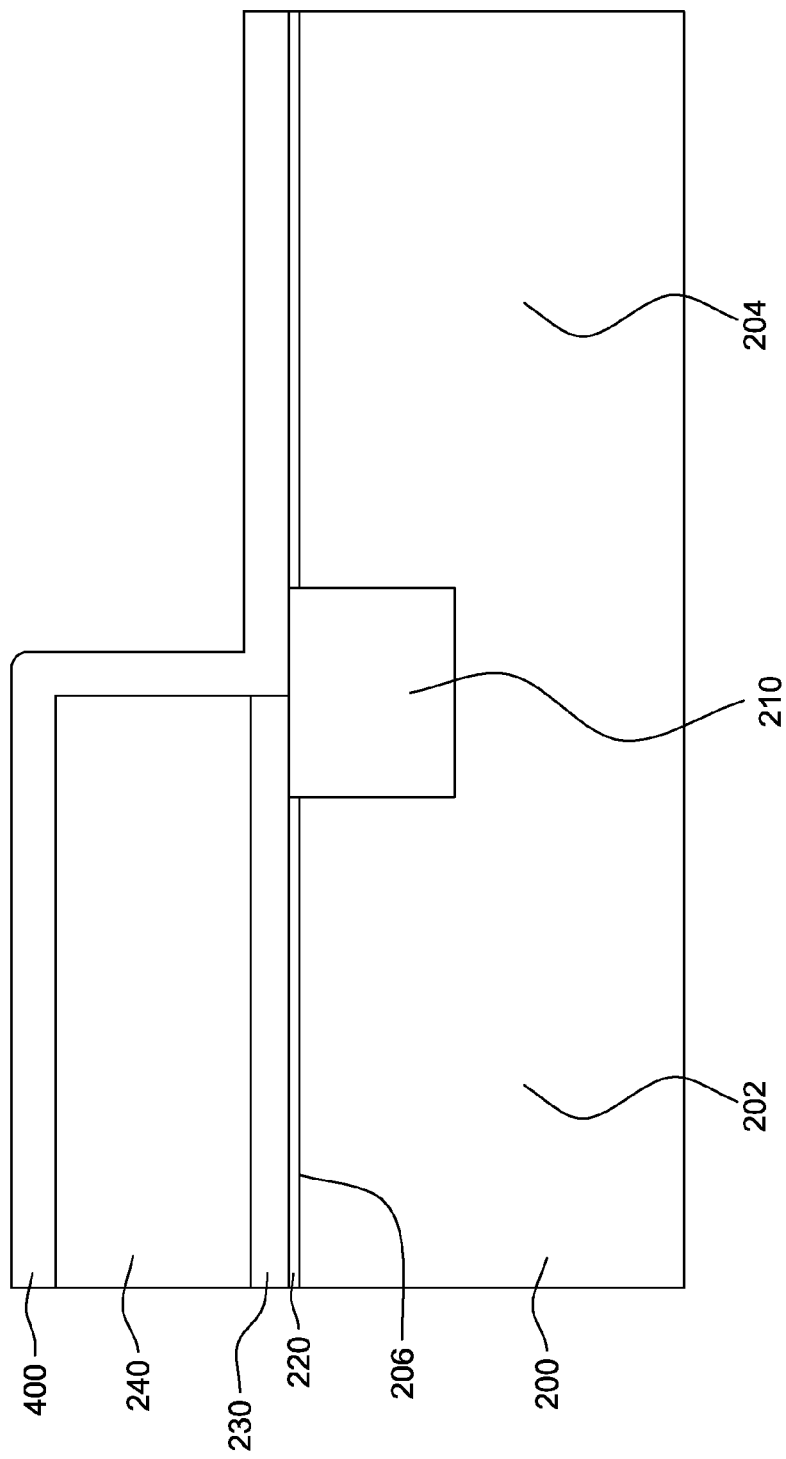
FIG. 4 is a schematic diagram illustrating a method step of the invention.

As illustrated in FIG. 3, reactive ion etching (RIE) is performed, wherein a portion of the nitride layer 250, a portion of the polysilicon layer 240, and a portion of the first metal layer 230 are removed from over the PFET region 204. After removing the photoresist PR, a second nitride layer 400 having an approximate height of 30-60 nm is formed over a portion of the polysilicon layer 240, a portion of the STI oxide member 210, and a portion of the gate oxide layer 220 (FIG. 4). The method then performs reactive ion etching to remove portions of the second nitride layer 400 that are situated over a portion of the STI oxide member 210 and over a portion of the gate oxide layer 220. Accordingly, a nitride cap 530 is formed over the NFET region 202; and, a portion of the STI oxide member 210 and a portion of the gate oxide layer 220 are exposed over the PFET region 204.

Figure 5:
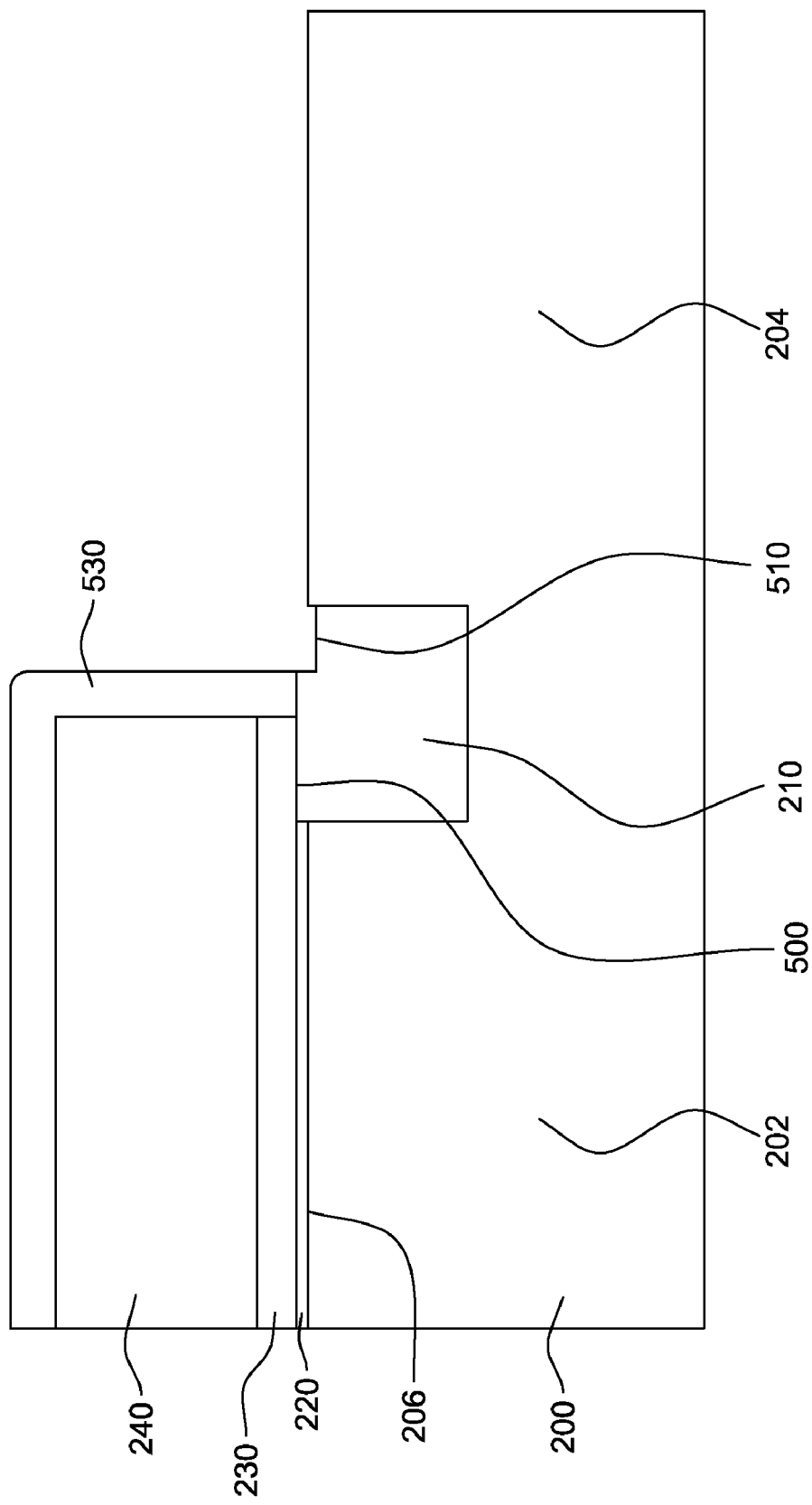
FIG. 5 is a schematic diagram illustrating a method step of the invention.

The gate oxide layer 220 over the PFET region 204 and a portion of the STI oxide member 210 are subsequently etched (FIG. 5). Thus, a notch is formed on a top surface of the STI oxide member 210, wherein a first upper surface 500 of the STI oxide member 210 is staggered from a second upper surface 510 of the STI oxide member 210. Specifically, the first upper surface 500 is situated above the top surface 206 of the substrate 200; and, the second upper surface 510 is situated below the top surface 206 of the substrate 200.

To ensure that the PFET 930 is built on a high quality silicon surface, the epitaxial silicon layer 600 is formed over the PFET region 204 (i.e., over the top surface 206 of the substrate 200). The epitaxial silicon layer 600 has an approximate height between 20-30 nm to adjust the height of the PFET 930 to the height of the NFET 920, as more fully described below. Next, a gate oxide layer 610 (also referred to herein as the "dielectric layer 610", the "gate oxide 610", or the "dielectric 610") is formed over a top surface and a sidewall of the epitaxial silicon layer 600. For example, the gate oxide layer 610 could be formed from high-k material, such as HfO$_2$, ZrO$_2$, Al$_2$O$_3$, TiO$_2$, La$_2$O$_3$, SrTiO$_3$, LaAlO$_3$, or mixtures thereof.

Figure 6:
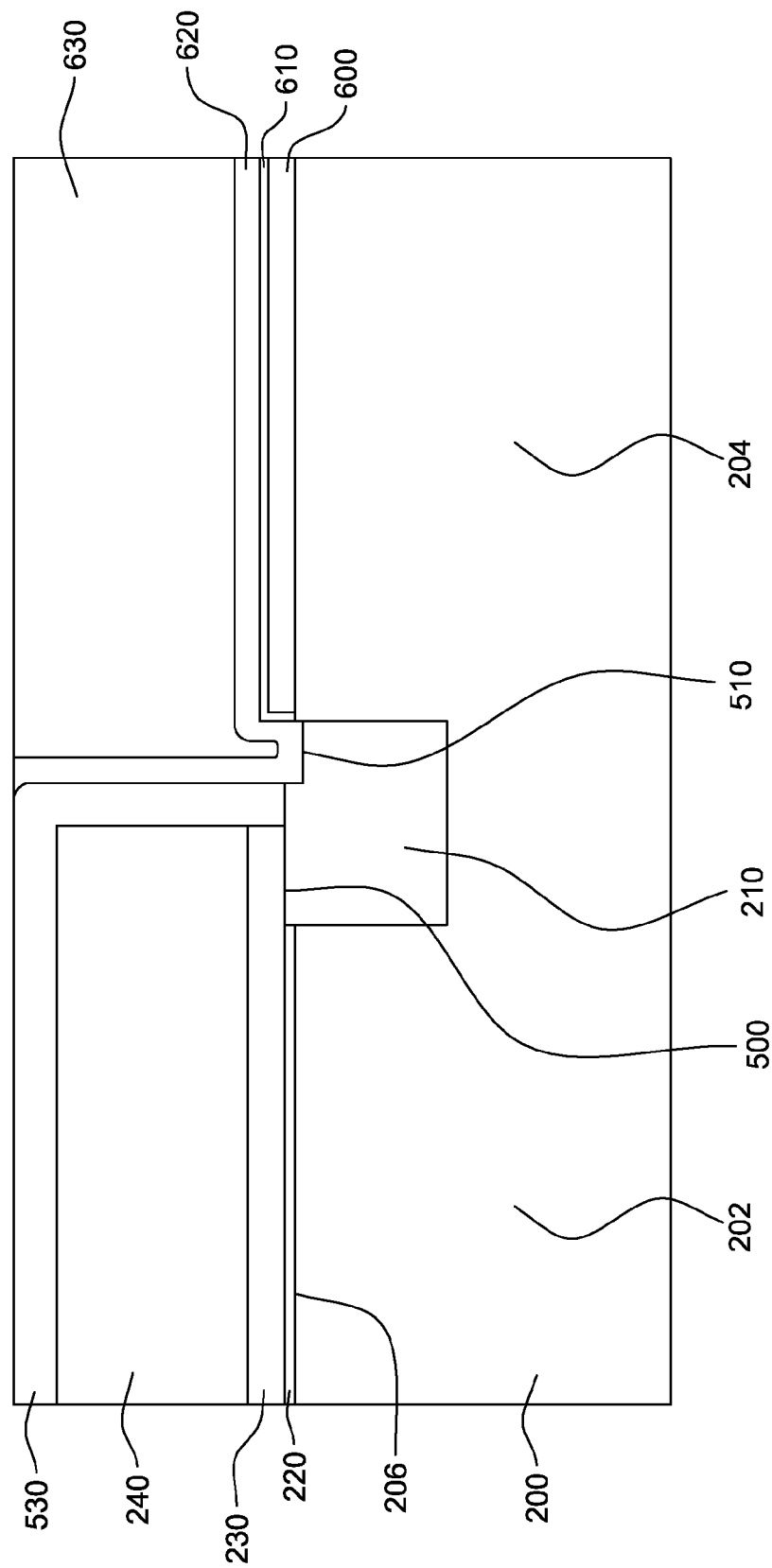
FIG. 6 is a schematic diagram illustrating a method step of the invention.

Following this, a second metal layer 620 (also referred to herein as the "first gate layer 620") is formed over the nitride cap 530, over the second upper surface 510 of the STI oxide member 210, and over the gate oxide layer 610. For example, a layer of tungsten having an approximate height of 10 nm-30 nm may be formed via atomic-layer-deposition, followed by nitridation to form thermally stable tungsten nitride. A polysilicon layer 630 (also referred to herein as the "second gate layer 630") having an approximate height of 120 nm-200 nm is subsequently formed over the second metal layer 620, wherein the polysilicon layer 630 may be pre-doped via p-type dopant implantation utilizing boron 1e15-4e15/cm$^2$. As illustrated in FIG. 6, chemical mechanical polishing (CMP) is performed over the polysilicon layer 630, stopping at a top surface of the nitride cap 530 over the NFET region 202. Since there is a nitride layer (i.e., the nitride cap 530) on the polysilicon layer 240 over the NFET region 202, the top of the polysilicon layer 630 over the PFET region 204 is higher (relative to the substrate) than that of the polysilicon layer 240 over the NFET region 202. The thickness of the nitride cap 530 can be used along with the top surface of the second metal layer 620 to adjust the thickness of the polysilicon layer 630 of the PFET 930. In this embodiment, preferably, the gate-conductor-height of the NFET 920 is similar to that for the PFET 930, i.e., the thickness of the polysilicon layer 240 plus the thickness of the first metal layer 230 for the NFET 920 is similar to the thickness of the polysilicon layer 630 plus the thickness of the second metal layer 620 for the PFET 930, which is also controlled by the thickness of the epitaxial silicon layer 600 in the PFET region 204.

Figure 7:
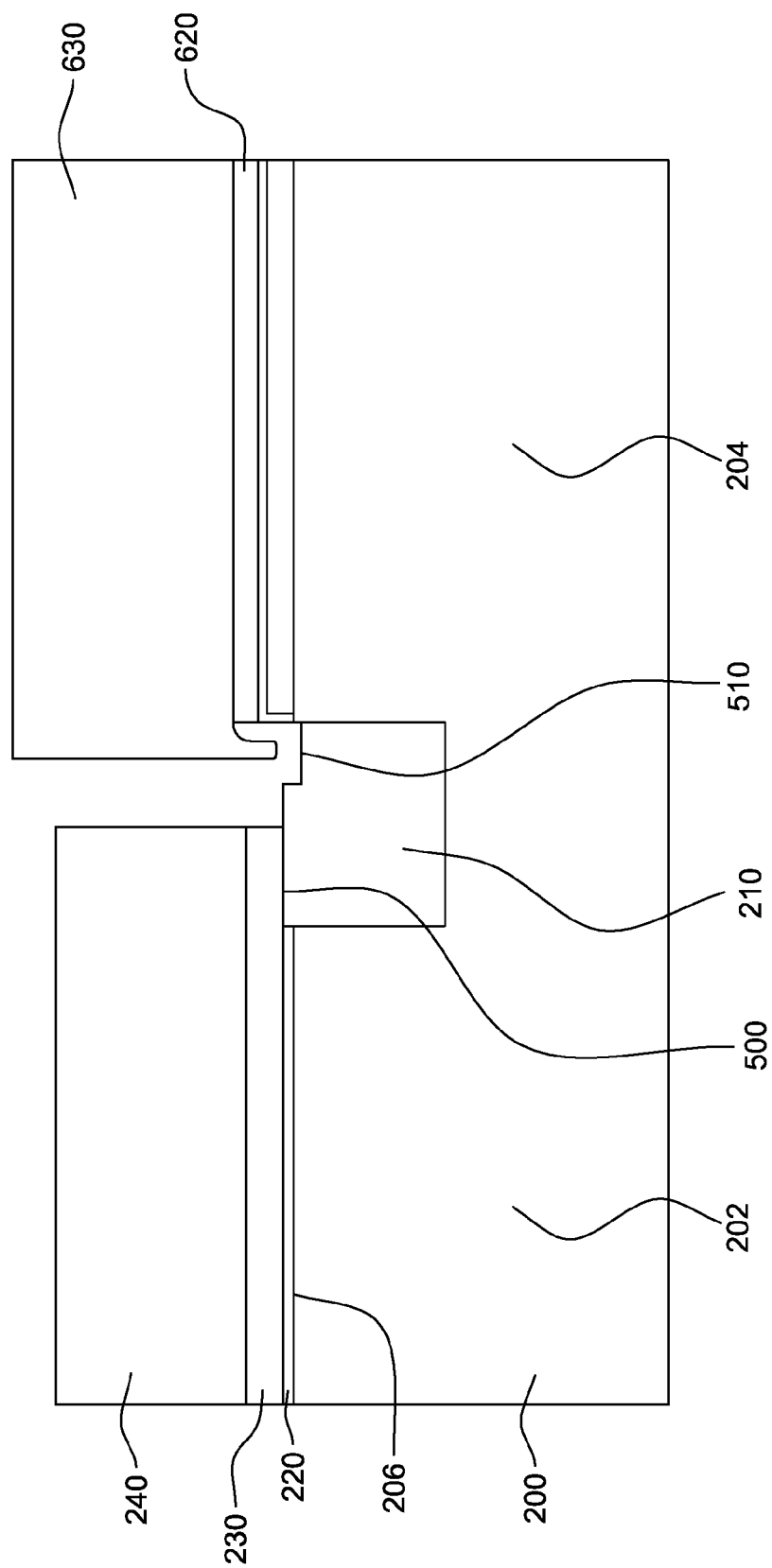
FIG. 7 is a schematic diagram illustrating a method step of the invention.
Figure 8:
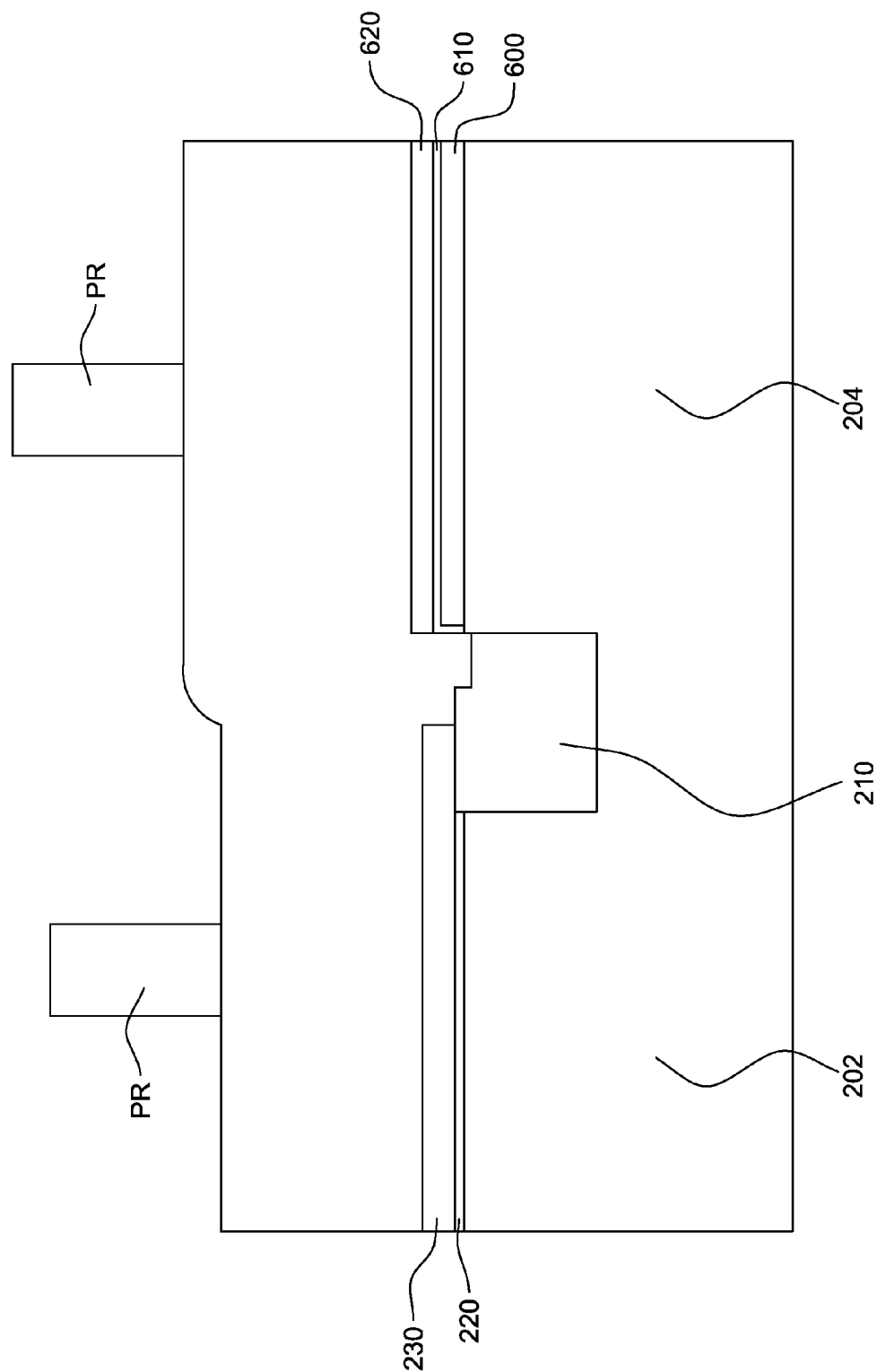
FIG. 8 is a schematic diagram illustrating a method step of the invention.

As illustrated in FIG. 7, a wet/dry etch is performed to remove the nitride cap 530 and to expose a sidewall of the second metal layer 620. The method then performs an isotropic etch to remove a portion of the second metal layer 620, wherein a void is created between the polysilicon layer 240 and the polysilicon layer 630. Next, polysilicon (approximately 30-50 nm) is formed over the polysilicon layer 240 and the polysilicon layer 630 to refill the void; and, a photoresist PR is positioned over the NFET region 202 and a photoresist PR is positioned over the PFET region 204 to pattern the NFET 920 and the PFET 930, respectively (FIG. 8). Polysilicon reactive ion etching is then performed, stopping at the first metal layer 230 and the second metal layer 620. Following this, reactive ion etching is performed on portions of the first metal layer 230 and on portions of the second metal layer 620, stopping at the gate oxide layer 220 and the gate oxide layer 610.

Figure 9:
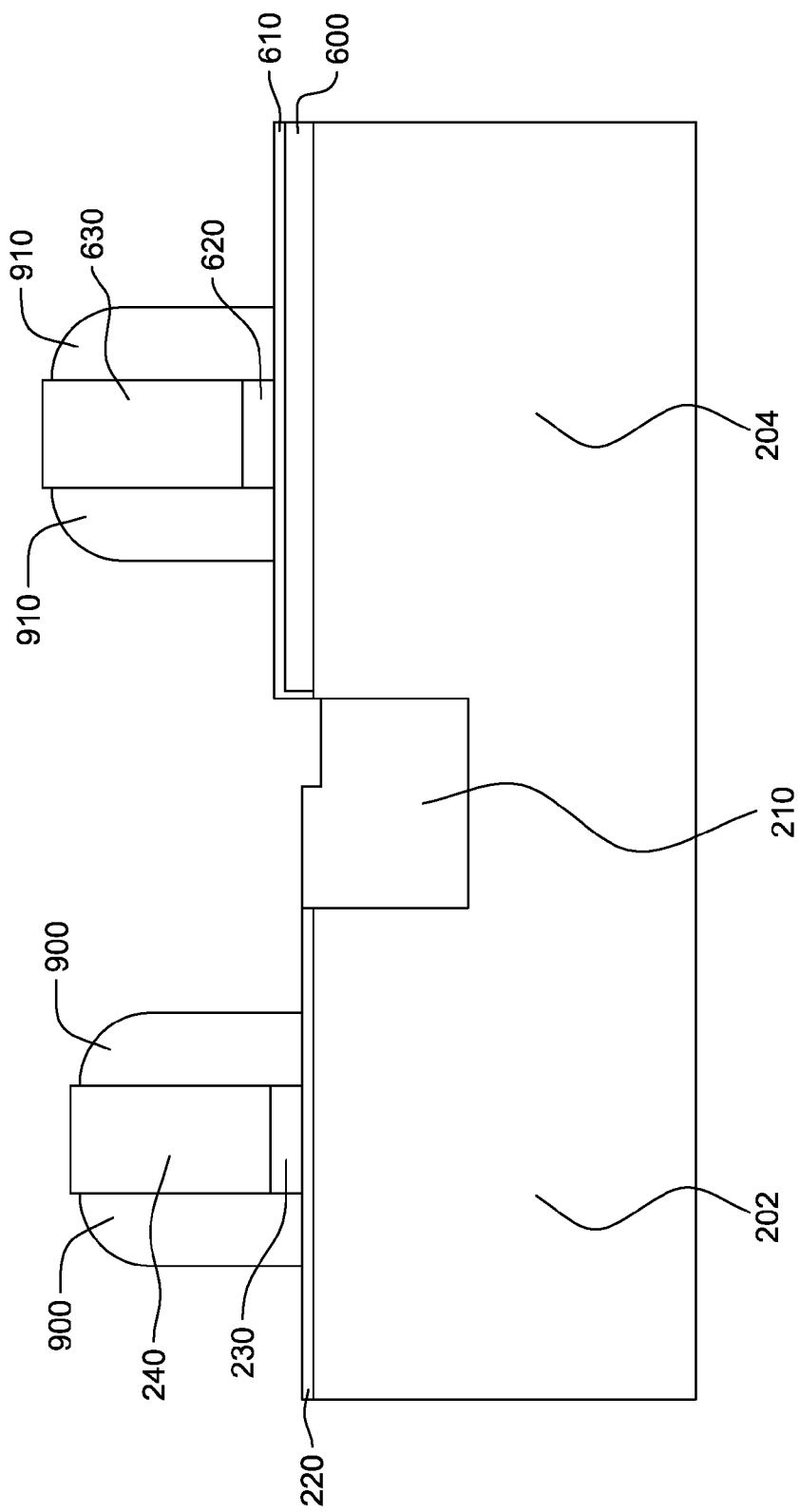
FIG. 9 is a schematic diagram illustrating a method step of the invention.

After the photoresists are removed, the spacers 900 and the spacers 910 are formed over the gate oxide layer 220 and the gate oxide layer 610, respectively, using conventional processes commonly known within the art. As illustrated in FIG. 9, the spacers 900 are situated proximate the first metal layer 230 and the polysilicon layer 240; and, the spacers 910 are situated proximate the second metal layer 620 and the polysilicon layer 630. Thus, the NFET 920 and the PFET 930 are formed over the NFET region 202 and over the PFET region 204, respectively. Other conventional processes may also be performed on the CMOS device 100, for example, re-oxidation, extension and halo implantation, source/drain implantation, source/drain annealing, and silicidation.

Embodiments of the invention further provide an alternative method for making the CMOS device 100. In such an alternative embodiment, the above method steps of the first embodiment are performed up to and including the chemical mechanical polishing step (i.e., FIGS. 2-6 and the accompanying text). Thus, after the chemical mechanical polishing step as illustrated in FIG. 6, the alternative method for making the CMOS device 100 forms an oxide layer 1000 over the polysilicon layer 630. The oxide layer 1000 has an approximate height of 10 nm-20 nm and is formed via thermal oxidation.

Figure 10:
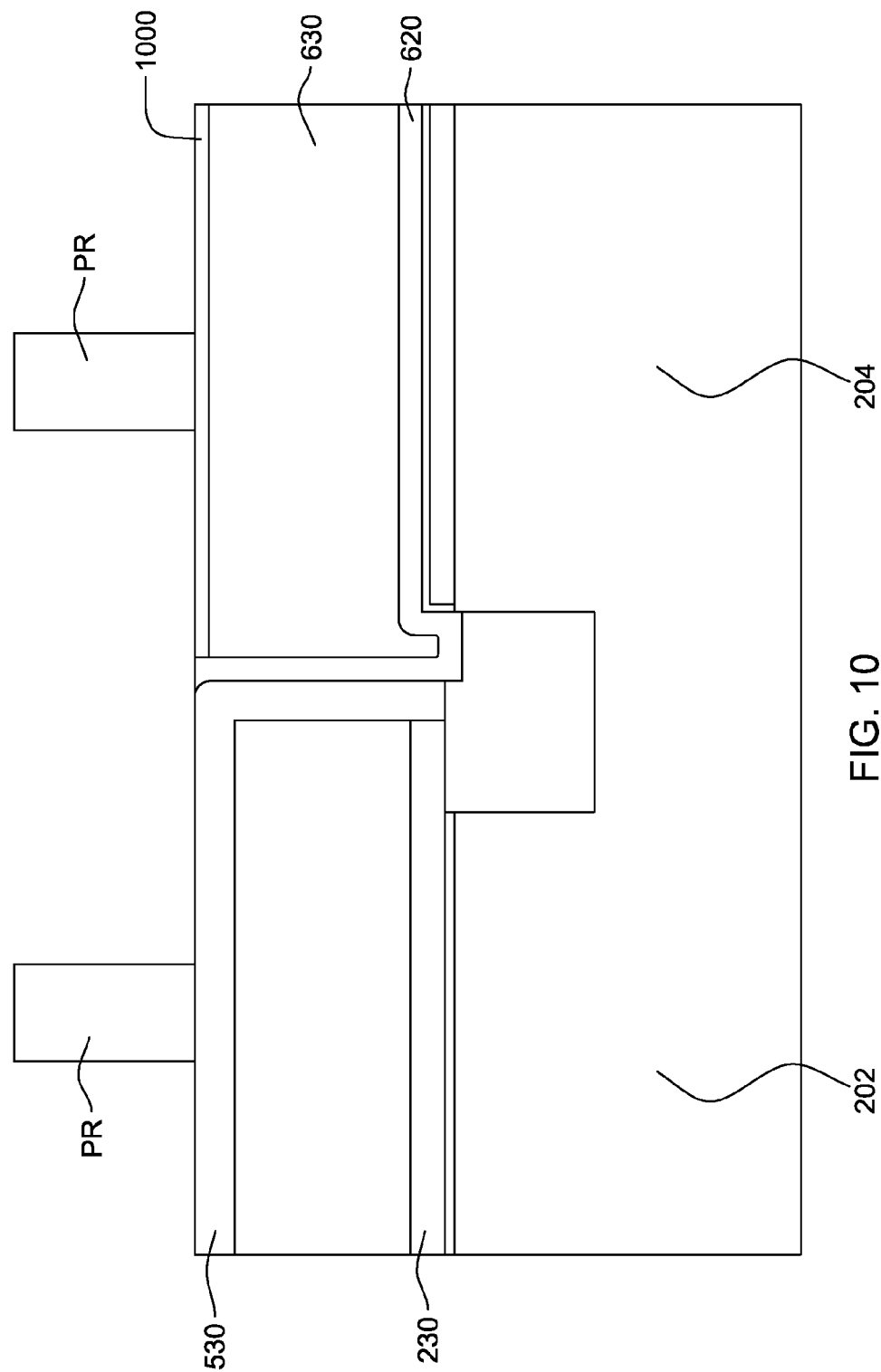
FIG. 10 is a schematic diagram illustrating an alternative method step of the invention.
Figure 11:
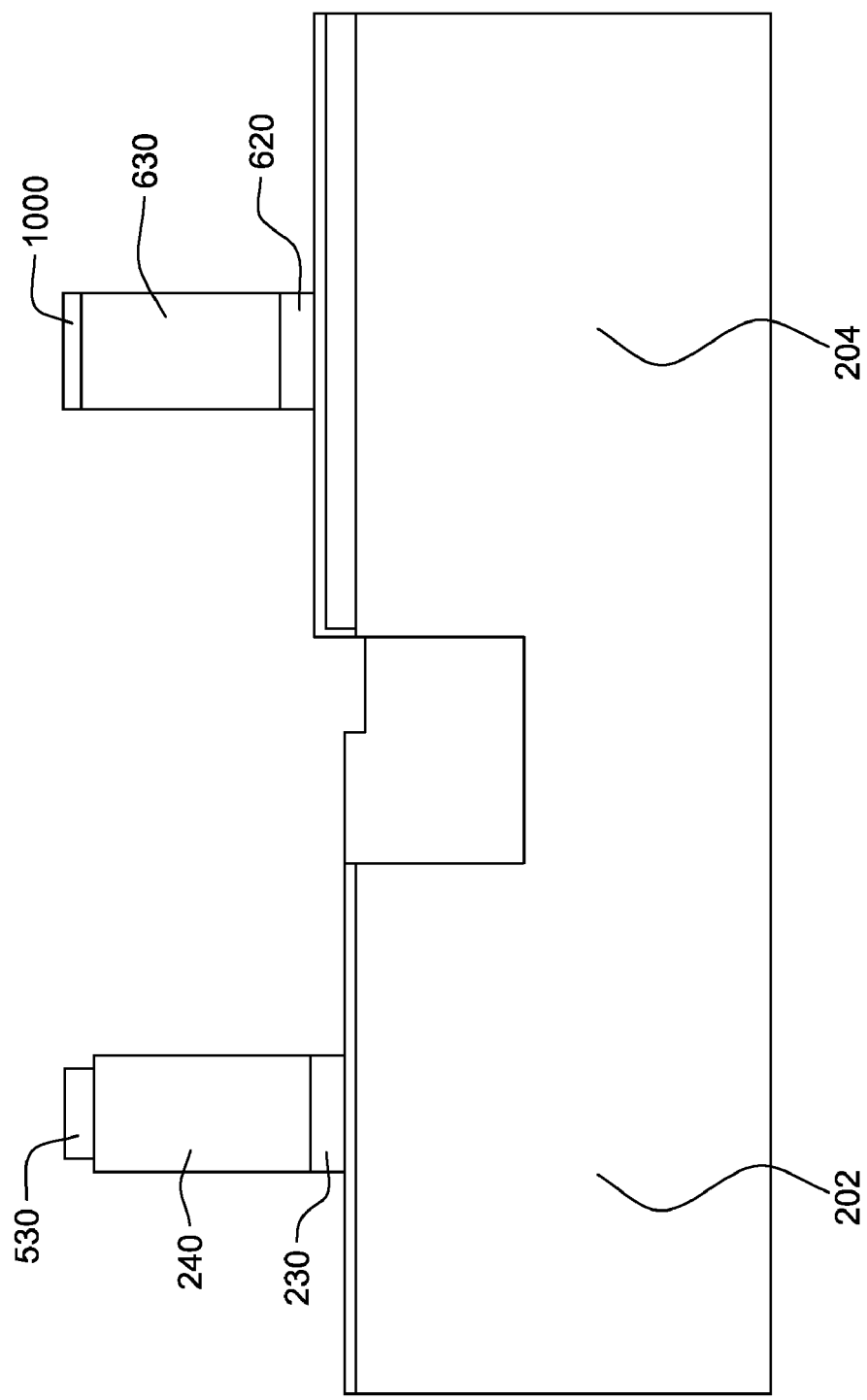
FIG. 11 is a schematic diagram illustrating an alternative method step of the invention.

As illustrated in FIG. 10, a photoresist PR is positioned over the nitride cap 530 and a photoresist PR is positioned over the oxide layer 1000 to pattern the NFET 920 and the PFET 930, respectively. Reactive ion etching is subsequently performed stopping at the first metal layer 230, wherein portions of the polysilicon layer 240 and a portion of the nitride cap 530 are removed. The method then performs a wet time etch to remove a remaining portion of the nitride cap 530 and a portion of the second metal layer 620. Next, as illustrated in FIG. 11, reactive ion etching is performed to remove portions of the oxide layer 1000, portions of the polysilicon layer 630, portions of the first metal layer 230, and portions of the second metal layer 620.

Figure 12:
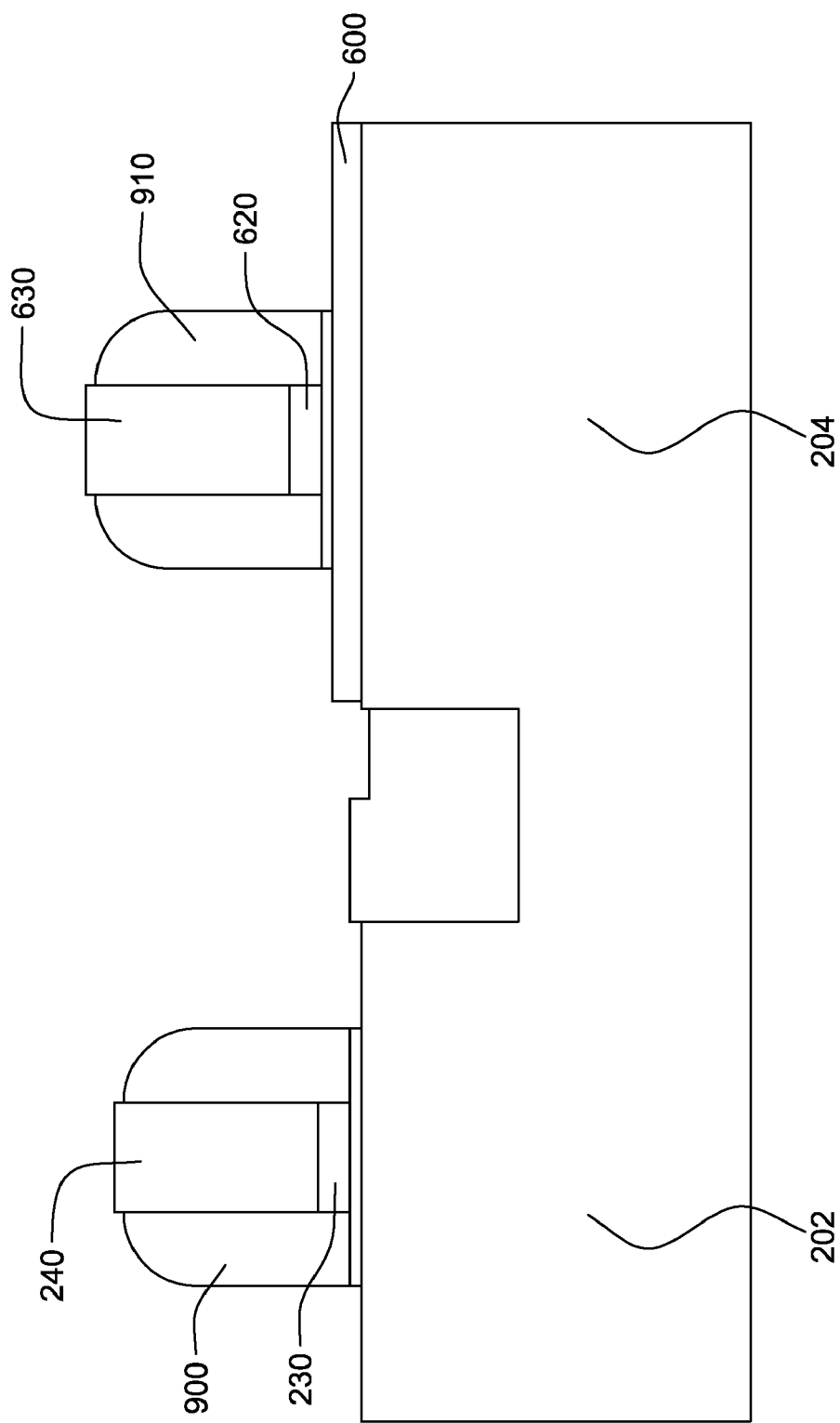
FIG. 12 is a schematic diagram illustrating an alternative method step of the invention.

After the photoresists are removed, the spacers 900 and the spacers 910 are formed over the gate oxide layer 220 and the gate oxide layer 610, respectively, using conventional processes commonly known within the art. As illustrated in FIG. 12, the spacers 900 are situated proximate the first metal layer 230 and the polysilicon layer 240; and, the spacers 910 are situated proximate the second metal layer 620 and the polysilicon layer 630. Thus, the NFET 920 and the PFET 930 are formed over the NFET region 202 and over the PFET region 204, respectively. Other conventional processes may also be performed on the CMOS device 100, for example, re-oxidation, extension and halo implantation, source/drain implantation, source/drain annealing, and silicidation.

Figure 13:
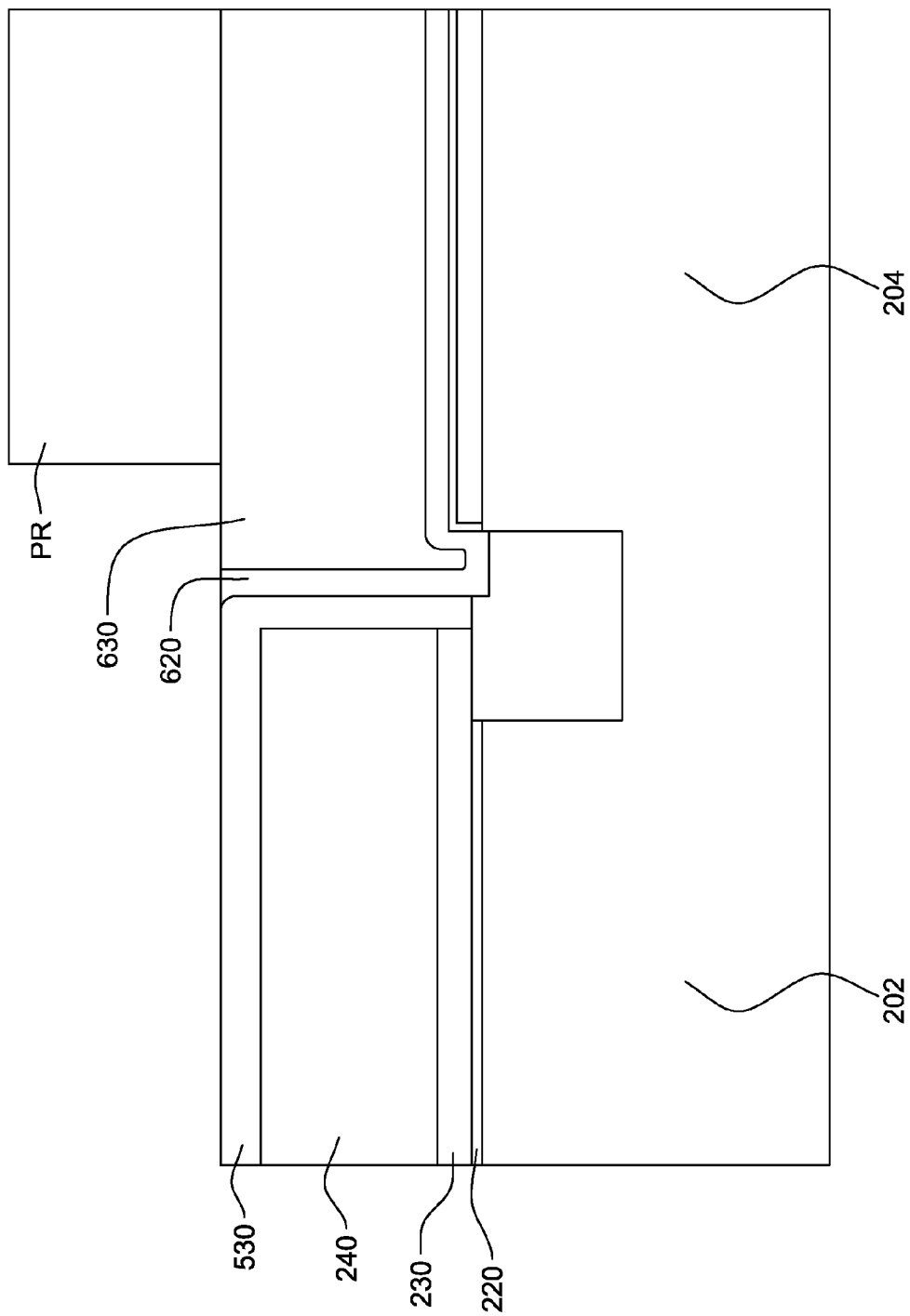
FIG. 13 is a schematic diagram illustrating an alternative method step of the invention.

Furthermore, embodiments of the invention provide yet another alternative method for making the CMOS device 100. In such an alternative embodiment, the above method steps of the first embodiment are performed up to and including the chemical mechanical polishing step (i.e., FIGS. 2-6 and the accompanying text). Thus, after the chemical mechanical polishing step as illustrated in FIG. 6, the alternative method for making the CMOS device 100 positions a photoresist PR over a portion of the polysilicon layer 630 (FIG. 13). Reactive ion etching is subsequently performed stopping at the second metal layer 620, wherein a portion of the polysilicon layer 630 is removed. The method then conducts a wet time etch to remove a portion of the second metal layer 620; and, a wet time etch to remove the nitride cap 530.

Figure 14:
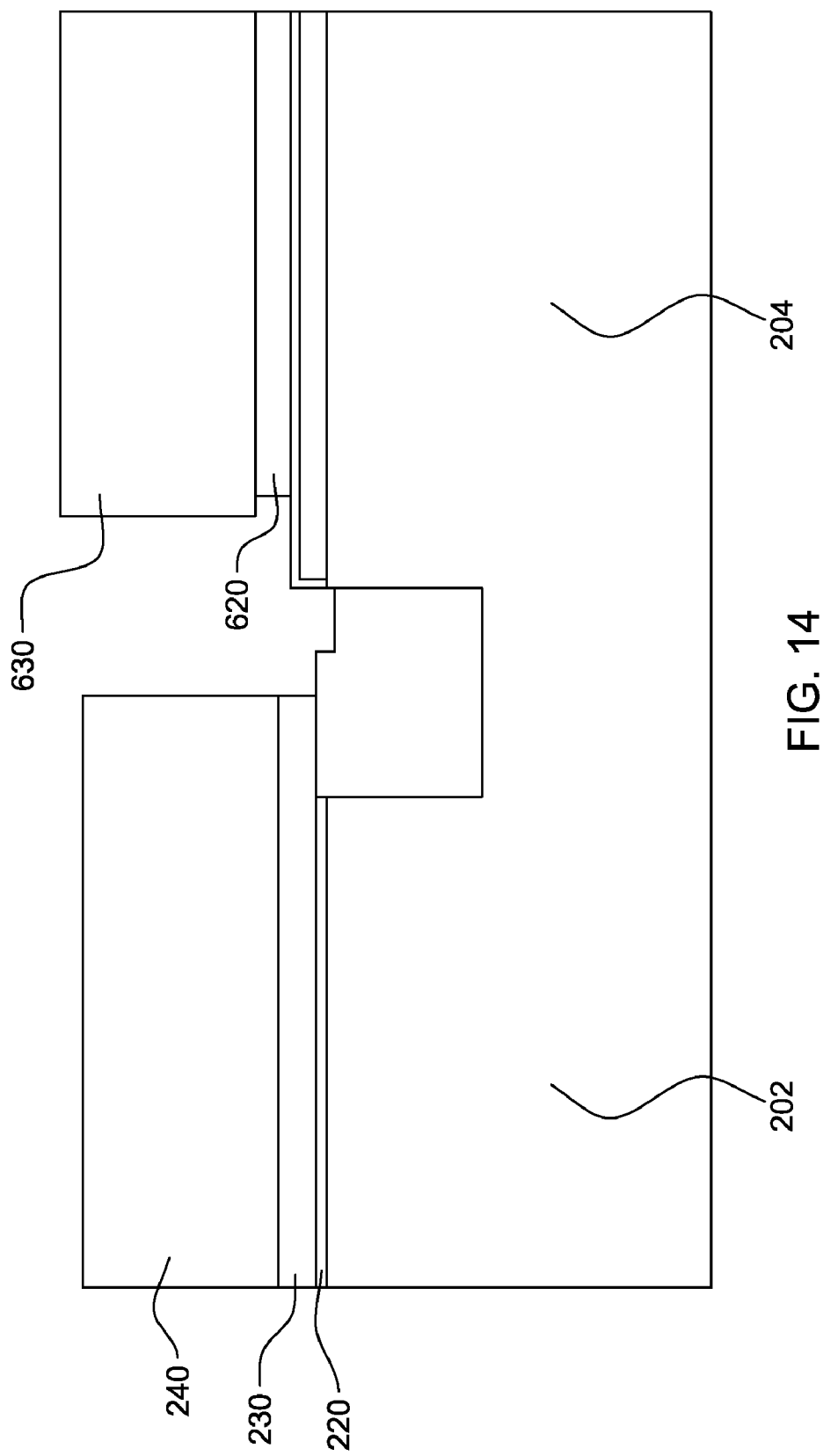
FIG. 14 is a schematic diagram illustrating an alternative method step of the invention.
Figure 15:
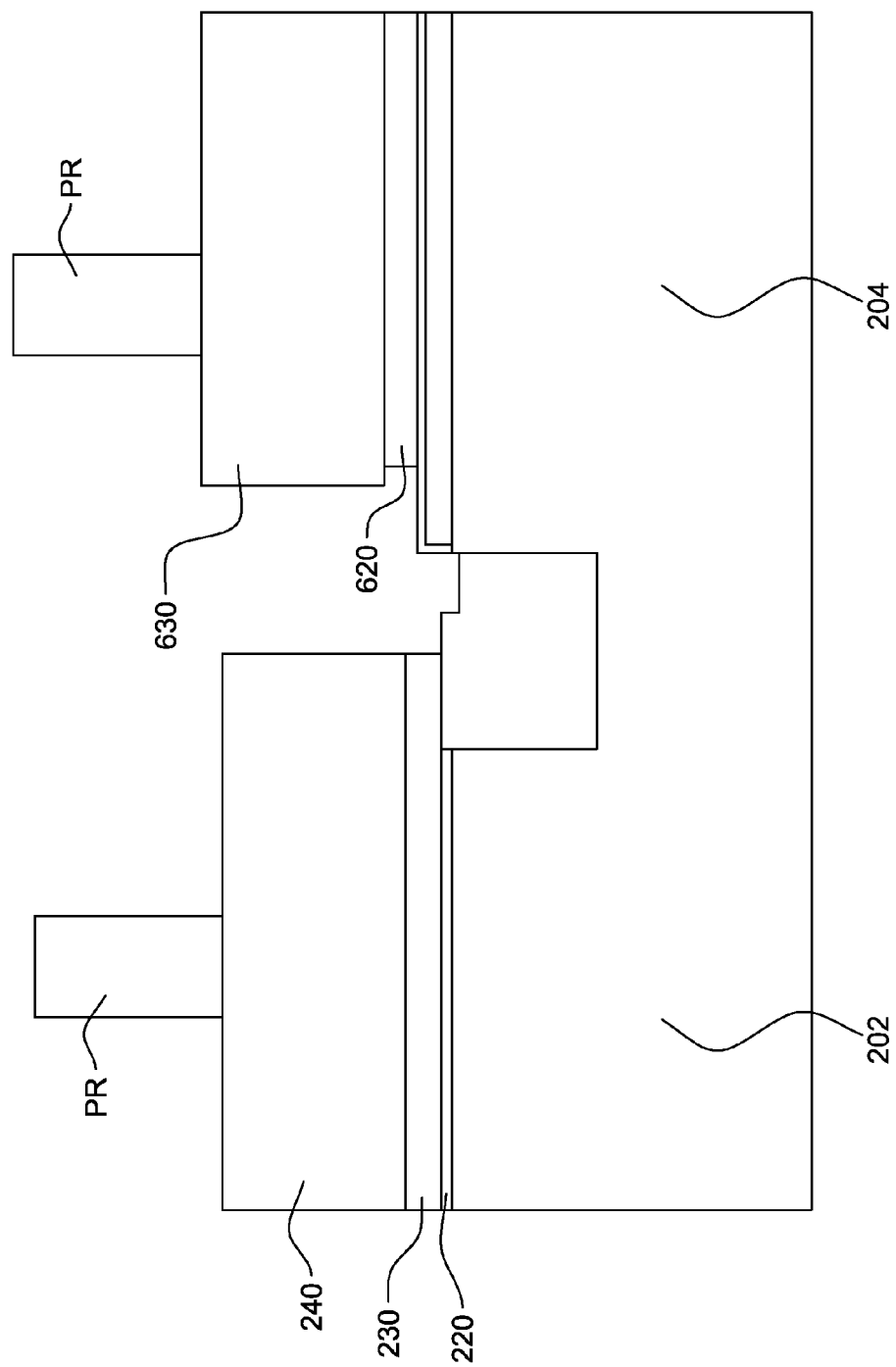
FIG. 15 is a schematic diagram illustrating an alternative method step of the invention.
Figure 16:
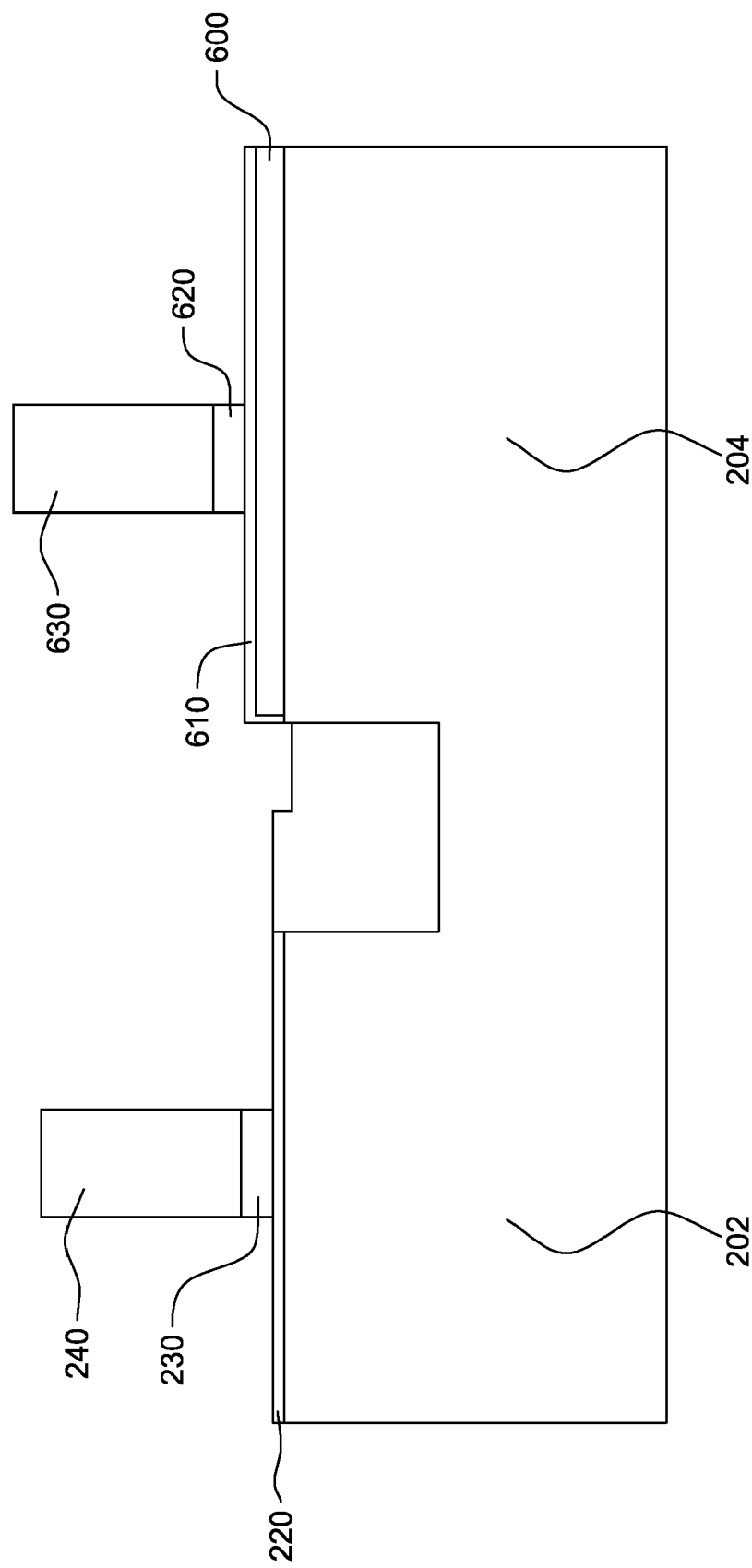
FIG. 16 is a schematic diagram illustrating an alternative method step of the invention.

As illustrated in FIG. 14, the photoresist PR is removed. Next, a photoresist PR is positioned over the polysilicon layer 240; and, a photoresist PR is positioned over the polysilicon layer 630 (FIG. 15). Following this, reactive ion etching is performed to remove portions of the polysilicon layer 240, portions of the polysilicon layer 630, portions of the first metal layer 230, and portions of the second metal layer 620 (FIG. 16).

Figure 17:
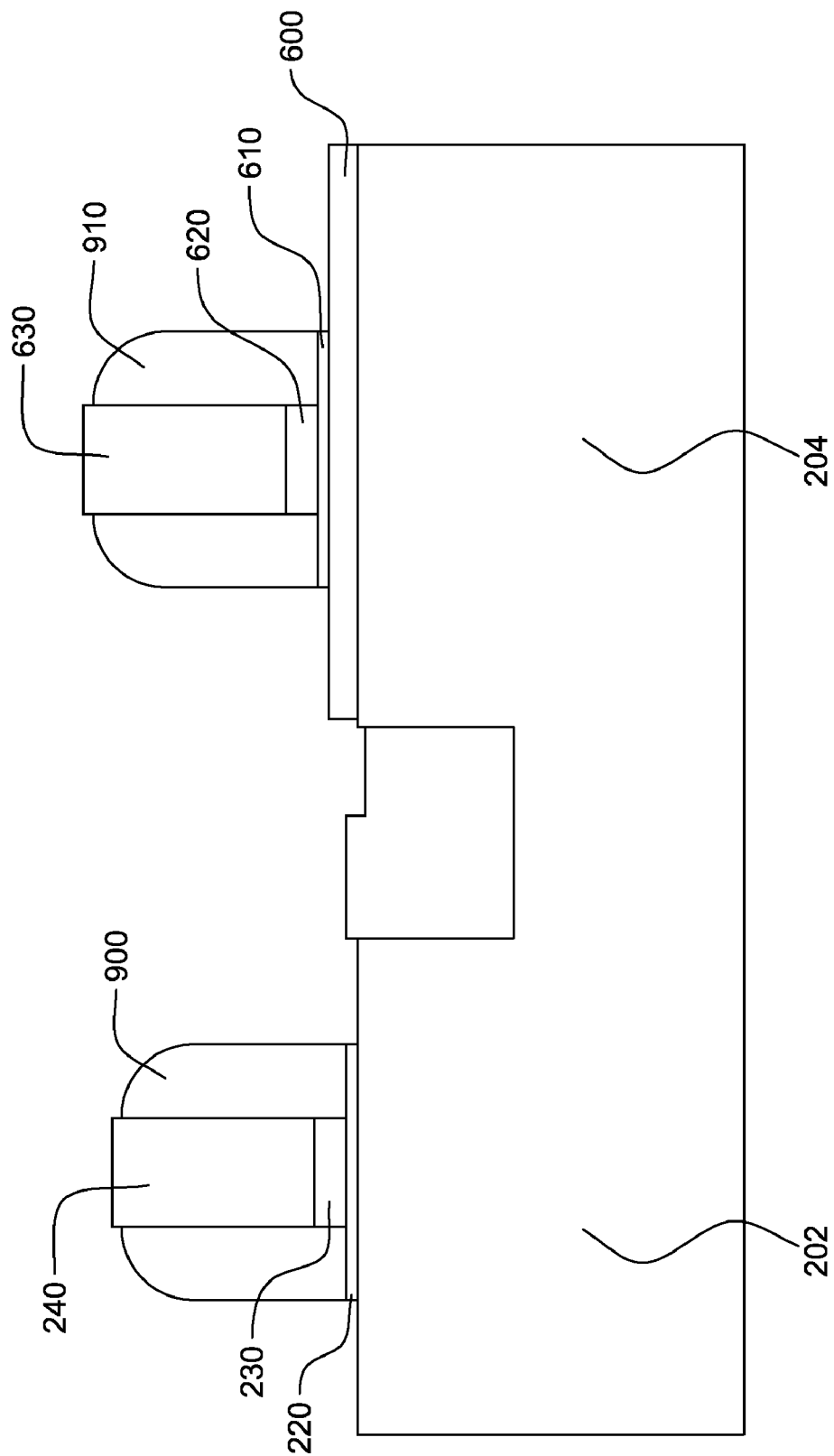
FIG. 17 is a schematic diagram illustrating an alternative method step of the invention.

After the photoresists are removed, the spacers 900 and the spacers 910 are formed over the gate oxide layer 220 and the gate oxide layer 610, respectively, using conventional processes commonly known within the art. As illustrated in FIG. 17, the spacers 900 are situated proximate the first metal layer 230 and the polysilicon layer 240; and, the spacers 910 are situated proximate the second metal layer 620 and the polysilicon layer 630. Thus, the NFET 920 and the PFET 930 are formed over the NFET region 202 and over the PFET region 204, respectively. Other conventional processes may also be performed on the CMOS device 100, for example, re-oxidation, extension and halo implantation, source/drain implantation, source/drain annealing, and silicidation.

Thus, embodiments herein present a structure and method to make a CMOS with dual metal gates. Specifically, the CMOS device 100 comprises a first gate (i.e., the first gate layer 230 and the second gate layer 240) comprising a first metal and a second gate (i.e., the first gate layer 620 and the second gate layer 630) comprising a second metal. The first gate comprises a portion of a first transistor (i.e., the NFET 920) that is complementary to a second transistor (i.e., the PFET 930) that includes the second gate, wherein the first gate and the second gate are situated on the same substrate (i.e., substrate 200).

Furthermore, the first metal produces a first threshold voltage characteristic, wherein the first metal comprises tantalum nitride. The second metal produces a second threshold voltage characteristic that differs from the first threshold voltage characteristic, wherein the second metal comprises tungsten nitride. As described above, the first metal and the second metal may be formed via atomic-layer-deposition (ALD) followed by nitridation, wherein the first gate and the second gate are used to control output currents (i.e., the flow of carriers) in the first transistor and the second transistor, respectively, as is commonly known within the art.

Additionally, as described above, the first gate and the second gate each comprise a second gate layer (i.e., the second gate layer 240 and the second gate layer 630, respectively); wherein the second gate layers comprise polysilicon. The second gate further comprises an epitaxial silicon layer (i.e., the epitaxial silicon layer 600). As described above, the epitaxial silicon layer 600 is situated over the substrate 200 to ensure that the first gate layer 620 and the second gate layer 630 of the PFET 930 are built on a high quality silicon surface. The epitaxial silicon layer 600 has an approximate height between 20-30 nm to adjust the combined height of the first gate layer 620 and the second gate layer 630 to a height that is substantially similar to the combined height of the first gate layer 230 and the second gate layer 240 of the NFET 920.

The CMOS device 100 further comprises a notched shallow trench isolation oxide region (i.e., STI oxide member 210) that is positioned between the first transistor and the second transistor. As described above, the STI oxide member 210 comprises a substantially square-shaped cross-section having an approximate width between 100-500 nm and an approximate depth between 100-1000 nm. Furthermore, the STI oxide member 210 comprises a notched top portion, wherein a first upper surface 500 is staggered from a second upper surface 510. Specifically, the first upper surface 500 is situated above a top surface 206 of the substrate 200; and the second upper surface 510 is situated below the top surface 206 of the substrate 200. In addition, the CMOS device 100 comprises a gate dielectric 220, wherein the gate dielectric 220 comprises SiO2, nitrided SiO2, HfO2, ZrO2, Al2O3, TiO2, La2O3, SrTiO3, LaAlO3, and/or mixtures thereof.

Figure 18:
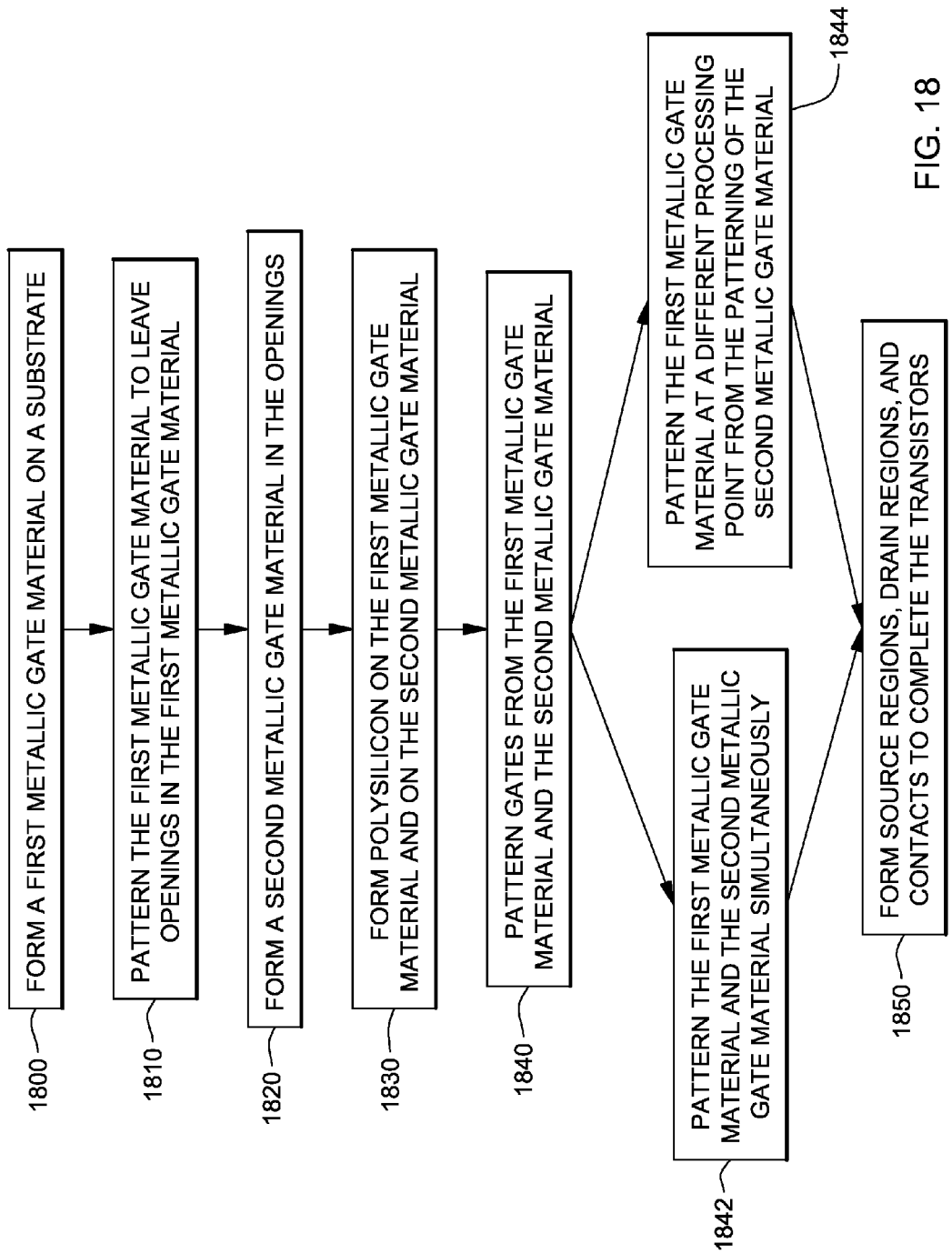
FIG. 18 is a flow diagram illustrating one embodiment of the invention.

FIG. 18 illustrates a flow diagram of a method of embodiments of the invention. In item 1800, the method forms a first metallic gate material on a substrate. For example, a layer of tantalum having an approximate height of 10 nm-30 nm may be formed via atomic-layer-deposition, followed by nitridation to form thermally stable tantalum nitride. Next, in item 1810 the method patterns the first metallic gate material to leave openings in the first metallic gate material.

In item 1820, a second metallic gate material is formed in the openings. For example, a layer of tungsten having an approximate height of 10 nm-30 nm may be formed via atomic-layer-deposition, followed by nitridation to form thermally stable tungsten nitride. Following this, in item 1830, polysilicon is formed on the first metallic gate material and on the second metallic gate material. As described above, the polysilicon can have an approximate height of 120 nm-200 nm, wherein the polysilicon may be pre-doped via p-type dopant implantation utilizing boron 1e15-4e15/cm².

Subsequently, in item 1840, the gates are patterned from the first metallic gate material and the second metallic gate material. The first metallic gate material and the second metallic gate material can be patterned simultaneously (item 1842); or, alternatively, the first metallic gate material could be patterned at a different processing point from the patterning of the second metallic gate material (item 1844). Next, in item 1850, the method forms source regions, drain regions, and contacts to complete the transistors.

Accordingly, embodiments herein present a structure and method to make a CMOS with dual metal gates. CMOS devices with polysilicon gates typically have a relatively large insulator thickness due to poly depletion. Metal gates can reduce insulator thickness for both n-type field effect transistors (NFETs) and p-type field effect transistors (PFETs); however, it is difficult to adjust the threshold voltage for both NFETs and PFETs in the same device. Recent research shows that metal gates are thermally stable for high temperature processes for both NFETs and PFETs. However, the art lacks a device and a process flow to manufacture such a device for both NFETs and PFETs on the same wafer. As such, embodiments of the invention provide a structure and a method for making a CMOS device with dual metal gates, wherein a metal gate NFET and a metal gate PFET are integrated on the same wafer to take advantage of MOSFETs. Specifically, embodiments of the invention use different metal gates to adjust the threshold voltage for the NFET and the PFET separately.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A complementary metal oxide semiconductor device, comprising:
   a first gate comprising a first metal, wherein said first metal produces a first threshold voltage characteristic;
   a second gate comprising a second metal, wherein said second metal produces a second threshold voltage characteristic that differs from said first threshold voltage characteristic, wherein said first gate comprises a portion of a first transistor that is complementary to a second transistor that includes said second gate, and wherein said first gate and said second gate are situated on the same substrate; and
   a notched shallow trench isolation oxide region positioned between said first transistor and said second transistor, wherein said notched shallow trench isolation oxide region comprises a first upper surface and a second upper surface, wherein said first upper surface is situated above said substrate, and wherein said second upper surface is situated below said substrate.

2. The complementary metal oxide semiconductor device according to claim 1, wherein said first metal comprises tantalum.

3. The complementary metal oxide semiconductor device according to claim 1, wherein said second metal comprises tungsten.

4. The complementary metal oxide semiconductor device according to claim 1, further comprising an epitaxial silicon layer situated below said second gate.

5. The complementary metal oxide semiconductor device according to claim 1, further comprising a gate dielectric comprising at least one of SiO2, nitrided SiO2, HfO2, ZrO2, Al2O3, TiO2, La2O3, SrTiO3, LaAlO3, and mixtures thereof.

6. A complementary metal oxide semiconductor device, comprising:
   a first gate comprising a first metal, wherein said first metal produces a first threshold voltage characteristic;
   a second gate comprising a second metal, wherein said second metal produces a second threshold voltage characteristic that differs from said first threshold voltage characteristic, wherein said first gate comprises a portion of a first transistor that is complementary to a second transistor that includes said second gate, and wherein said first gate and said second gate are situated on the same substrate;
   an epitaxial silicon layer situated below said second gate; and
   a notched shallow trench isolation oxide region positioned between said first transistor and said second transistor, wherein said notched shallow trench isolation oxide region comprises a first upper surface and a second upper surface, wherein said first upper surface is situated above said substrate, and wherein said second upper surface is situated below said substrate.

7. The complementary metal oxide semiconductor device according to claim 6, wherein said first metal comprises tantalum.

8. The complementary metal oxide semiconductor device according to claim 6, wherein said second metal comprises tungsten.

9. The complementary metal oxide semiconductor device according to claim 6, further comprising a gate dielectric comprising at least one of SiO2, nitrided SiO2, HfO2, ZrO2, Al2O3, TiO2, La2O3, SrTiO3, LaAlO3, and mixtures thereof.

10. A complementary metal oxide semiconductor device, comprising:
   a first gate comprising a first metal, wherein said first metal produces a first threshold voltage characteristic;
   a second gate comprising a second metal, wherein said second metal produces a second threshold voltage characteristic that differs from said first threshold voltage characteristic, wherein said first gate comprises a portion of a first transistor that is complementary to a second transistor that includes said second gate, and wherein said first gate and said second gate are situated on the same substrate; and
   a notched shallow trench isolation oxide region positioned between said first transistor and said second transistor, wherein said notched shallow trench isolation oxide region comprises a first upper surface and a second upper surface, wherein said first upper surface is situated above said substrate, and wherein said second upper surface is situated below said substrate.

11. The complementary metal oxide semiconductor device according to claim 10, wherein said first metal comprises tantalum.

12. The complementary metal oxide semiconductor device according to claim 10, wherein said second metal comprises tungsten.

13. The complementary metal oxide semiconductor device according to claim 10, further comprising an epitaxial silicon layer situated below said second gate.

* * * * *